(12) United States Patent
Kim

(10) Patent No.: US 11,475,971 B1
(45) Date of Patent: Oct. 18, 2022

(54) SEMICONDUCTOR DEVICE AND SEMICONDUCTOR SYSTEM FOR TESTING ERROR CORRECTION CIRCUIT

(71) Applicant: SK hynix Inc., Icheon-si (KR)

(72) Inventor: Keun Kook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/353,423

(22) Filed: Jun. 21, 2021

(30) Foreign Application Priority Data

Mar. 31, 2021 (KR) ........................ 10-2021-0042383

(51) Int. Cl.
| | | |
|---|---|---|
| G11C 29/42 | (2006.01) | |
| G11C 29/14 | (2006.01) | |
| G11C 29/12 | (2006.01) | |
| G11C 29/00 | (2006.01) | |
| G11C 29/44 | (2006.01) | |

(52) U.S. Cl.
CPC ........ *G11C 29/42* (2013.01); *G11C 29/12015* (2013.01); *G11C 29/14* (2013.01); *G11C 29/4401* (2013.01); *G11C 29/789* (2013.01)

(58) Field of Classification Search
None
See application file for complete search history.

(56) References Cited

U.S. PATENT DOCUMENTS 10,706,950 B1 * 7/2020 Gallagher .............. G11C 29/46

FOREIGN PATENT DOCUMENTS

KR 1020190043043 A 4/2019

* cited by examiner

*Primary Examiner* — James G Norman
(74) *Attorney, Agent, or Firm* — William Park & Associates Ltd.

(57) ABSTRACT

A semiconductor device includes a control circuit configured to generate an input enable signal, an output enable signal, a latch control signal, and an error correction control signal based on a write control signal, a write check command, and a read check command for performing an error correction test mode; a latch circuit configured to generate latch data, a latch parity, and a latch masking signal by latching input data, an input parity, and an input masking signal and configured to re-store corrected data as the latch data, during a period in which the latch control signal is enabled; and an error correction circuit configured to generate the corrected data by correcting an error, included in the latch data, based on the latch data, the latch parity and the latch masking signal during a period in which the error correction control signal is enabled.

20 Claims, 12 Drawing Sheets

SEMICONDUCTOR DEVICE AND SEMICONDUCTOR SYSTEM FOR TESTING ERROR CORRECTION CIRCUIT

CROSS-REFERENCE TO RELATED APPLICATION

The present application claims priority under 35 U.S.C. § 119(a) to Korean application number 10-2021-0042383, filed in the Korean Intellectual Property Office on Mar. 31, 2021, the entire disclosure of which is incorporated herein by reference in its entirety.

BACKGROUND

1. Technical Field

Embodiments of the present disclosure relate to a semiconductor system which tests, in an error correction test mode, an error correction circuit included in a semiconductor device.

2. Related Art

Recently, in order to increase the operating speed of a semiconductor device, various schemes of inputting/outputting data with a plurality of bits in each clock cycle are being used. In the case in which an input/output speed of data is increased, the probability of an error occurring during a data transmission process also increases. Therefore, a separate device and method for ensuring the reliability of data transmission are additionally demanded.

For example, there is a method of generating error codes capable of checking the occurrence of an error and transmitting the error codes together with data, at each time when data is transmitted, thereby ensuring the reliability of data transmission. The error codes include an error detection code (EDC) that is capable of detecting an occurred error and an error correction code (ECC) that is capable of self-correcting an error upon occurrence of the error.

SUMMARY

In an embodiment, a semiconductor device may include: a control circuit configured to generate an input enable signal, an output enable signal, a latch control signal, and an error correction control signal based on a write control signal, a write check command, a read control signal, and a read check command for performing an error correction test mode; a latch circuit configured to generate latch data, a latch parity, and a latch masking signal by latching input data, an input parity, and an input masking signal and configured to re-store corrected data as the latch data, during a period in which the latch control signal is enabled; and an error correction circuit configured to generate the corrected data by correcting an error, included in the latch data, based on the latch data, the latch parity and the latch masking signal during a period in which the error correction control signal is enabled.

In an embodiment, a semiconductor system may include: a controller configured to test an error correction circuit that is included in a semiconductor device, by outputting a command for entering an error correction test mode, outputting first external data, a first external parity, and a first masking information signal to the semiconductor device and receiving a second external data and a second masking information signal that are output from the semiconductor device; and the semiconductor device, including the error correction circuit, configured to correct an error, included in the first external data, based on the first external data, the first external parity, and the first masking information signal, output the error-corrected first external data as the second external data, and output error information on the first external data as the second masking information signal.

DETAILED DESCRIPTION

Figure 1:
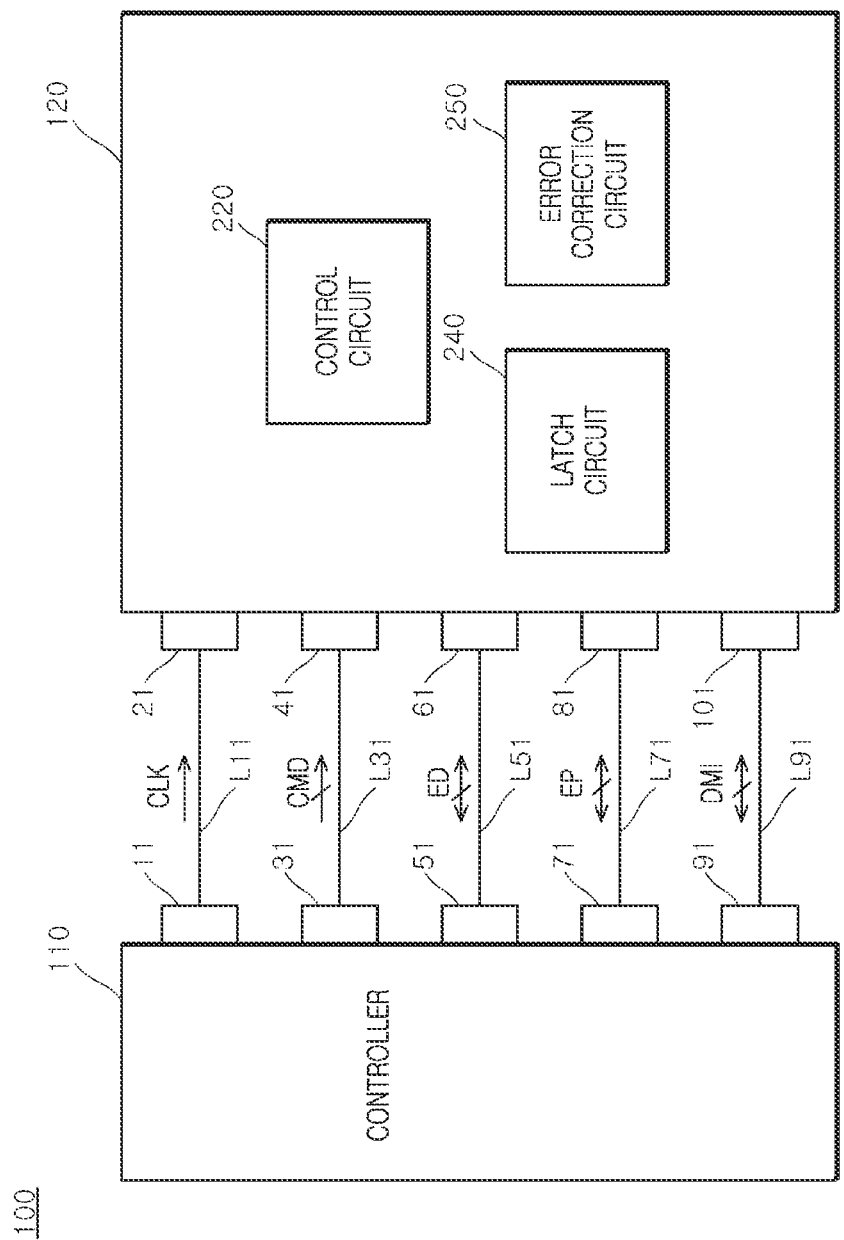
FIG. 1 is a block diagram illustrating a configuration of a semiconductor system in accordance with an embodiment of the disclosure.

The term "preset" means that the numerical value of a parameter is predetermined when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal with "logic high level" is distinguished from a signal with "logic low level." For example, when a signal with a first voltage corresponds to a "logic high level," a signal with a second voltage may correspond to a "logic low level." According to an embodiment, a "logic high level" may be set to a voltage higher than a "logic low level." According to an embodiment, the logic levels of signals may be set to different logic levels or opposite logic levels. For example, a signal with a logic high level may be set to have a logic low level according to an embodiment, and a signal with a logic low level may be set to have a logic high level according to an embodiment.

Hereafter, the teachings of the present disclosure will be described in more detail through embodiments. The embodiments are only used to exemplify the teachings of the present disclosure, and the scope of the present disclosure is not limited by the embodiments.

Various embodiments are directed to a semiconductor system which tests an error correction circuit in an error correction test mode by correcting an error of error-including external data through the error correction circuit included in a semiconductor device and detecting, by a controller, whether the error of the external data is corrected.

According to the embodiments of the disclosure. It is possible to test an error correction circuit in an error correction test mode by correcting an error of error-including external data through the error correction circuit included in a semiconductor device and detecting, by a controller, whether the error of the external data is corrected.

Also, according to the embodiments of the disclosure, by testing the error correction circuit, included in the semiconductor device, in the error correction test mode, it is possible to secure the reliability of data whose error is corrected through the error correction circuit in a normal mode.

As illustrated in FIG. 1, a semiconductor system 100, in accordance with an embodiment of the disclosure, may include a controller 110 and a semiconductor device 120. The semiconductor device 120 may include a control circuit 220, a latch circuit 240, and an error correction circuit 250.

The controller 110 may include a first control pin 11, a second control pin 31, a third control pin 51, a fourth control pin 71 and a fifth control pin 91. The semiconductor device 120 may include a first semiconductor pin 21, a second semiconductor pin 41, a third semiconductor pin 61, a fourth semiconductor pin 81 and a fifth semiconductor pin 101, A first transmission line L11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81, A fifth transmission line L91 may be coupled between the fifth control pin 91 and the fifth semiconductor pin 101. The controller 110 may transmit a clock CLK to the semiconductor device 120 through the first transmission line L11 in order to control the semiconductor device 120. The controller 110 may transmit a command CMD to the semiconductor device 120 through the second transmission line L31 in order to control the semiconductor device 120. The controller 110 and the semiconductor device 120 may transmit and receive external data ED through the third transmission line L51, The controller 110 and the semiconductor device 120 may transmit and receive an external parity EP through the fourth transmission line L71, The controller 110 and the semiconductor device 120 may transmit and receive a masking information signal DMI through the fifth transmission line L91.

The controller 110 may output, to the semiconductor device 120, the clock CLK and the command CMD for performing an error correction test mode operation. In an error correction test mode, the controller 110 may output, to the semiconductor device 120, the external data ED that includes an error. In the error correction test mode, the controller 110 may output, to the semiconductor device 120, the external parity EP that includes error information on the external data ED which does not include an error. In the error correction test mode, the controller 110 may output, to the semiconductor device 120, the masking information signal DMI for blocking some bits that are included in the external data ED. In the error correction test mode, the controller 110 may test the error correction circuit 250 that is included in the semiconductor device 120 by receiving the external data ED and the masking information signal DMI, In the error correction test mode, when the external data ED that is output from the semiconductor device 120 is error-corrected, the controller 110 may confirm that the error correction circuit 250 performs a normal operation. In the error correction test mode, when the external data ED output from the semiconductor device 120 is not error-corrected, the controller 110 may confirm that the error correction circuit 250 performs an abnormal operation. In the error correction test mode, when a parity that is output as the masking information signal DMI output from the semiconductor device 120 is normally generated, the controller 110 may confirm that the error correction circuit 250 performs a normal operation. In the error correction test mode, when a parity that is output as the masking information signal DMI that is output from the semiconductor device 120 is not normally generated, the controller 110 may confirm that the error correction circuit 250 performs an abnormal operation. The command CMD, the external data ED, the external parity EP and the masking information signal DMZ may be successively input and output in synchronization with odd pulses or even pulses that are included in the dock CLK.

The control circuit 220 may generate a latch control signal LC_CTR (see FIG. 2) and an error correction control signal ECC_CTR (see FIG. 2) based on a write control signal WEC (see FIG. 2), a read control signal REC (see FIG. 2), a write check command WCS (see FIG. 2), and a read check command RCS (see FIG. 2), which are generated based on the logic levels of the command CMD and a code signal CODE (see FIG. 2) for performing the error correction test mode.

The latch circuit 240 may generate latch data LD (see FIG. 2), a latch parity LP (see FIG. 2) and a latch masking signal LDMI (see FIG. 2) by latching input data IN_D (see FIG. 2), an input parity IN_P (see FIG. 2) and an input masking signal IN_DMI (see FIG. 2) during a period in which the latch control signal LC_CTR (see FIG. 2) is enabled. The latch circuit 240 may re-store corrected data CD (see FIG. 2), generated as an error that is included in the input data IN_D (see FIG. 2) is corrected, as the latch data LD (see FIG. 2). The input data IN_D (see FIG. 2) may be generated from the external data ED, the input parity IN_P (see FIG. 2) may be generated from the external parity EP, and the input masking signal IN_DMI (see FIG. 2) may be generated from the masking information signal DMI.

The error correction circuit 250 may generate the corrected data CD (see FIG. 2) by correcting an error that is included in the latch data LD (see FIG. 2) based on the latch data LD (see FIG. 2), the latch parity LP (see FIG. 2) and the latch masking signal LDMI (see FIG. 2) during a period in which the error correction control signal ECC_CTR (see FIG. 2) is enabled. During the period in which the error correction control signal ECC_CTR (see FIG. 2) is enabled, the error correction circuit 250 may generate the corrected data CD (see FIG. 2) by correcting an error that is included in the latch data LD (see FIG. 2) by performing an ECC decoding operation.

In the error correction test mode, the semiconductor device 120 may correct an error that is included in the external data ED, based on the external data ED, the external parity EP and the masking information signal DMI. In the error correction test mode, the semiconductor device 120 may output the error-corrected external data ED and the masking information signal DMI to the controller 110.

Figure 2:
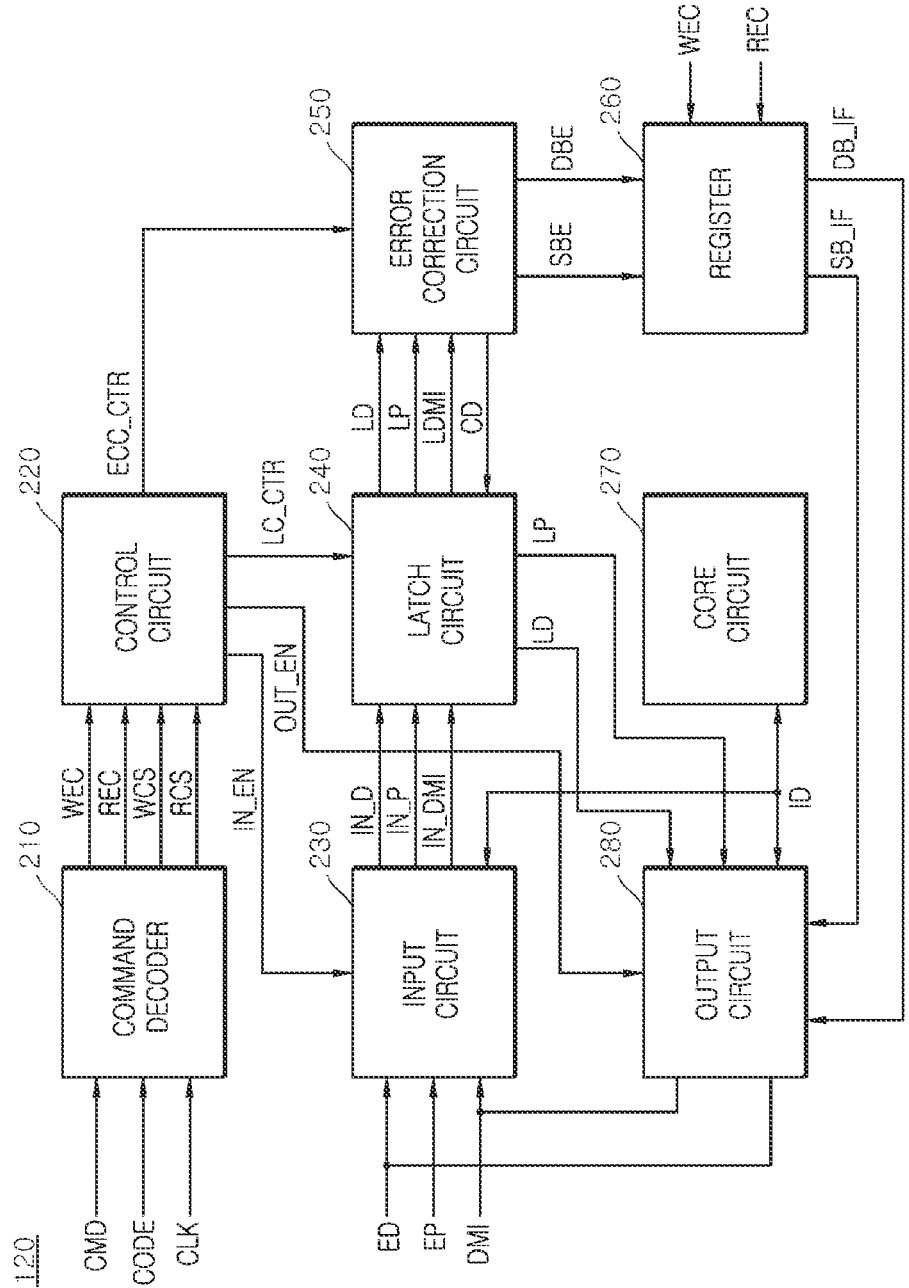
FIG. 2 is a block diagram illustrating a configuration of a semiconductor device included in the semiconductor system illustrated in FIG. 1.

FIG. 2 is a block diagram illustrating a configuration of an embodiment of the semiconductor device 120. As illustrated in FIG. 2, the semiconductor device 120 may include a command decoder 210, the control circuit 220, an input circuit 230, the latch circuit 240, the error correction circuit 250, a register 260, a core circuit 270 and an output circuit 280.

The command decoder 210 may generate the write control signal WEC and the read control signal REC based on a logic level of the code signal CODE in synchronization with the dock CLK. The command decoder 210 may generate the write control signal WEC and the read control signal REC which are selectively enabled, by decoding the code signal CODE in synchronization with the clock CLK. The code signal CODE may be set as a signal which is internally generated to enter the error correction test mode. While the code signal CODE is illustrated as one signal, it is to be noted that the code signal CODE may be set as a signal that includes a plurality of bits. The command decoder 210 may generate the write check command WCS and the read check command RCS based on a logic level of the command CMD in synchronization with the clock CLK.

The command decoder 210 may generate the write check command WCS and the read check command RCS which are selectively enabled, by decoding the command CMD in synchronization with the clock CLK. The command CMD may be set as a signal which is input from the controller 110 to enter the error correction test mode. While the command CMD is illustrated as one signal, it is to be noted that the command CMD may be set as a signal that includes a plurality of bits.

The control circuit 220 may generate an input enable signal IN_EN, an output enable signal OUT_EN, the latch control signal LC_CTR, and the error correction control signal ECC_CTR based on the write control signal WEC, the read control signal REC, the write check command WCS, and the read check command RCS. The control circuit 220 may generate the input enable signal IN_EN, the output enable signal OUT_EN, the latch control signal LC_CTR, and the error correction control signal ECC_CTR based on the logic levels of the write control signal WEC, the read control signal REC, the write check command WCS, and the read check command RCS.

The input circuit 230 may generate the input data the input parity IN_P, and the input masking signal IN_DMI from internal data ID, the external data ED, the external parity EP, and the masking information signal DMI during a period in which the input enable signal IN_EN is enabled. During the period in which the input enable signal IN_EN is enabled, the input circuit 230 may generate the input data IN_D by blocking some bits of the external data ED based on the masking information signal DMI and replacing the blocked some bits of the external data ED with the internal data ID. During the period in which the input enable signal IN_EN is enabled, the input circuit 230 may generate the input parity IN_P and the input masking signal IN DMI by buffering the external parity EP and the masking information signal DMI.

When the error correction test mode is ended and a normal mode is entered, the input circuit 230 may generate the internal data ID by buffering the external data ED.

During the period in which the latch control signal LC_CTR is enabled, the latch circuit 240 may generate the latch data LD, the latch parity LP and the latch masking signal LDMI by latching the input data IN_D, the input parity IN_P and the input masking signal IN_DMI. During the period in which the latch control signal LC_CTR is enabled, the latch circuit 240 may re-store the corrected data CD generated as an error that is included in the input data IN_D is corrected, as the latch data LD. During the period in which the latch control signal LC_CTR is enabled, the latch circuit 240 may re-store the latch parity LP that includes error information on the input data IN_D.

During the period in which the error correction control signal ECC_CTR is enabled, the error correction circuit 250 may generate the corrected data CD by correcting an error, included in the latch data LD, based on the latch data LD, the latch parity LP, and the latch masking signal LDMI. During the period in which the error correction control signal ECC_CTR is enabled, the error correction circuit 250 may generate the corrected data CD by correcting an error, included in the latch data LD, by performing the ECC decoding operation. During the period in which the error correction control signal ECC_CTR is enabled, the error correction circuit 250 may generate the latch parity LP that includes error information on the latch data LD, by performing an ECC encoding operation, During the period in which the error correction control signal ECC_CTR is enabled, the error correction circuit 250 may generate a single bit error signal SBE, which is enabled when an error that is included in the latch data LD is 1 bit, by performing the ECC decoding operation. During the period in which the error correction control signal ECC_CTR is enabled, the error correction circuit 250 may generate a double bit error signal DBE, which is enabled when an error that is included in the latch data LD is at least 2 bits, by performing the ECC decoding operation. The ECC decoding operation may include an operation of detecting an error, included in the latch data LD, by using an error correction code (ECC) and inverting a bit of the latch data LD in which the error has occurred, based on a detection result. The ECC decoding operation may include an operation of generating a parity, including information on an error that is included in the latch data LD, by using the error correction code (ECC).

The register 260 may be initialized at a time point when the write control signal WEC and the read control signal REC are input. After being initialized, the register 260 may store the single bit error signal SBE and the double bit error signal DBE. When the error correction test mode is ended and a mode register read operation is entered, the register 260 may output the stored single bit error signal SBE as a single bit error information signal SB_IF. When the error correction test mode is ended and the mode register read operation is entered, the register 260 may output the stored double bit error signal DBE as a double bit error information signal DB_IF. The register 260 may be implemented with a mode register set (MRS) which stores operation information of the semiconductor device 120.

When the error correction test mode is performed, the core circuit 270 may output the internal data ID stored therein to the input circuit 230. When the error correction test mode is ended and the normal mode is performed, the core circuit 270 may store the internal data ID input from the input circuit 230. When the error correction test mode is ended and the normal mode is performed, the core circuit 270 may output the internal data ID stored therein to the output circuit 280.

The output circuit 280 may generate the external data ED and the masking information signal DMI from the latch data LD and the latch parity LP during a period in which the output enable signal OUT_EN is enabled. During the period in which the output enable signal OUT_EN is enabled, the output circuit 280 may output the latch data LD as the external data ED. During the period in which the output enable signal OUT_EN is enabled, the output circuit 280 may output the latch parity LP as the masking information signal DMI. During the period in which the output enable signal OUT_EN is enabled, the output circuit 280 may output the external data ED and the masking information signal DMI to the controller 110. When the error correction test mode is ended and the normal mode is entered, the output circuit 280 may generate the external data ED from the internal data ID and output the generated external data ED to the controller 110. When the error correction test mode is ended and the mode register read operation is performed, the output circuit 280 may generate the external data ED from the single bit error information signal SB_IF and the double bit error information signal DB_IF and may output the generated external data ED to the controller 110.

Figure 3:
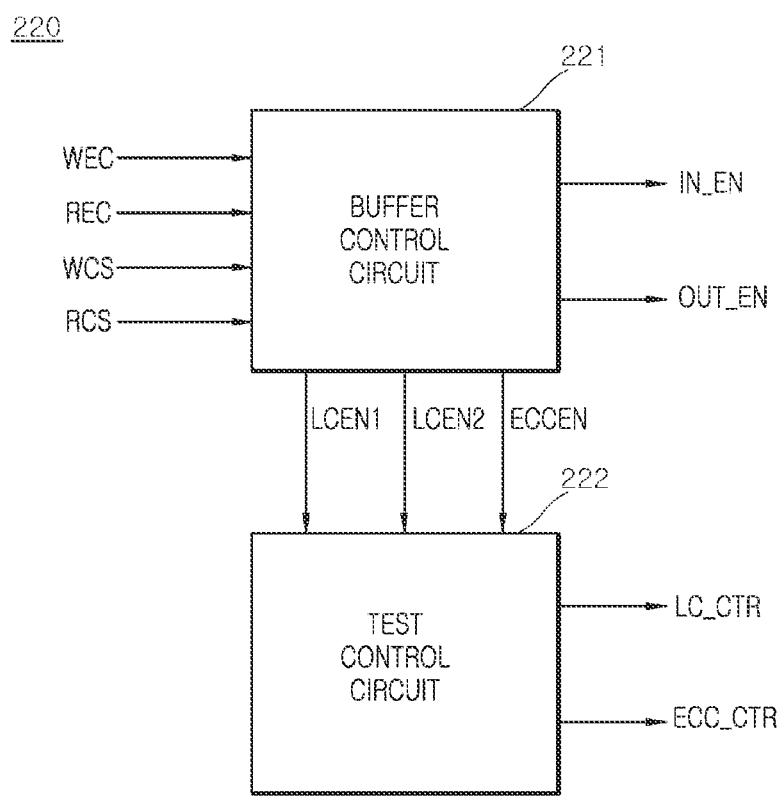
FIG. 3 is a block diagram illustrating a configuration of a control circuit included in the semiconductor device illustrated in FIG. 2.

FIG. 3 is a block diagram illustrating a configuration of an embodiment of the control circuit 220. As illustrated in FIG. 3, the control circuit 220 may include a buffer control circuit 221 and a test control circuit 222.

The buffer control circuit 221 may generate a first latch enable signal LCEN1, a second latch enable signal LCEN2, an error correction enable signal ECCEN, the input enable signal IN_EN, and the output enable signal OUT_EN based on the write control signal WEC, the read control signal REC, the write check command WCS, and the read check command RCS. The buffer control circuit 221 may generate the first latch enable signal LCEN1, the second latch enable signal LCEN2, the error correction enable signal ECCEN, the input enable signal IN_EN, and the output enable signal OUT_EN, based on the logic levels of the write control signal WEC, the read control signal REC, the write check command WCS, and the read check command RCS.

The test control circuit 222 may generate the latch control signal LC_CTR and the error correction control signal ECC_CTR based on the first latch enable signal LCEN1, the second latch enable signal LCEN2, and the error correction enable signal ECCEN. The test control circuit 222 may generate the latch control signal LC_CTR and the error correction control signal ECC_CTR based on logic levels of the first latch enable signal LCEN1, the second latch enable signal LCEN2, and the error correction enable signal ECCEN.

Figure 4:
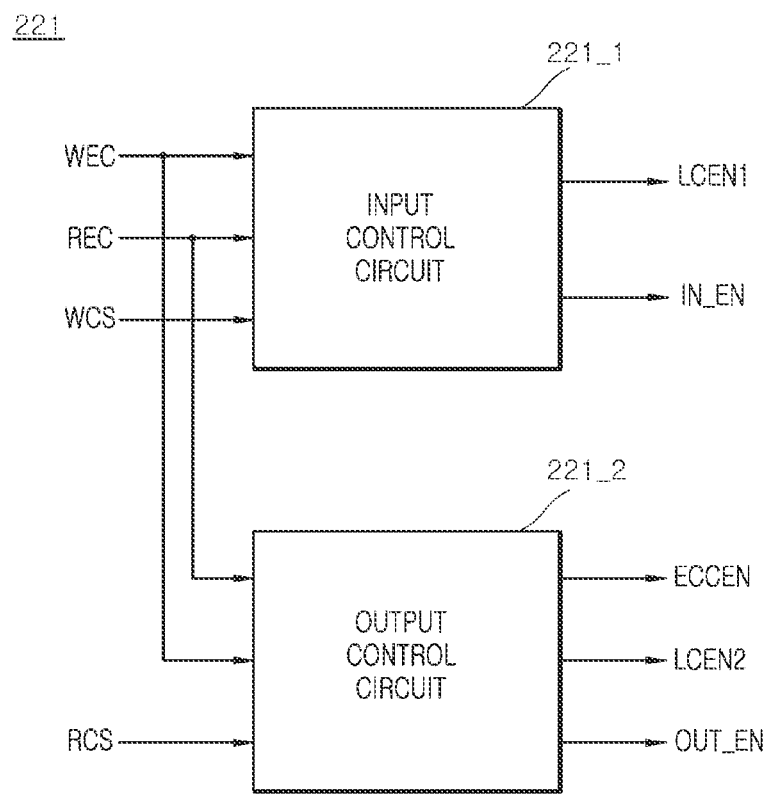
FIG. 4 is a block diagram illustrating a configuration of a buffer control circuit included in the control circuit illustrated in FIG. 3.

FIG. 4 is a block diagram illustrating a configuration of an embodiment of the buffer control circuit 221. As illustrated in FIG. 4, the buffer control circuit 221 may include an input control circuit 221_1 and an output control circuit 221_2.

The input control circuit 221_1 may generate the first latch enable signal LCEN1 and the input enable signal IN_EN based on the write control signal WEC, the read control signal REC, and the write check command WCS. The input control circuit 221_1 may generate the first latch enable signal LCEN1 and the input enable signal IN_EN based on logic levels of the write control signal WEC, the read control signal REC, and the write check command WCS. The logic levels of the write control signal WEC, the read control signal REC, and the write check command WCS for generating the first latch enable signal LCEN1 and the input enable signal IN_EN in the input control circuit 2211 will be described later in detail with reference to FIG. 5.

The output control circuit 221_2 may generate the error correction enable signal ECCEN, the second latch enable signal LCEN2, and the output enable signal OUT_EN based on the write control signal WEC, the read control signal REC, and the read check command RCS. The output control circuit 221_2 may generate the error correction enable signal ECCEN, the second latch enable signal LCEN2, and the output enable signal OUT_EN based on the logic levels of the write control signal WEC, the read control signal REC, and the read check command RCS. The logic levels of the write control signal WEC, the read control signal REC, and the read check command RCS for generating the error correction enable signal ECCEN, the second latch enable signal LCEN2, and the output enable signal OUT_EN in the output control circuit 221_2 will be described later in detail with reference to FIG. 6.

Figure 5:
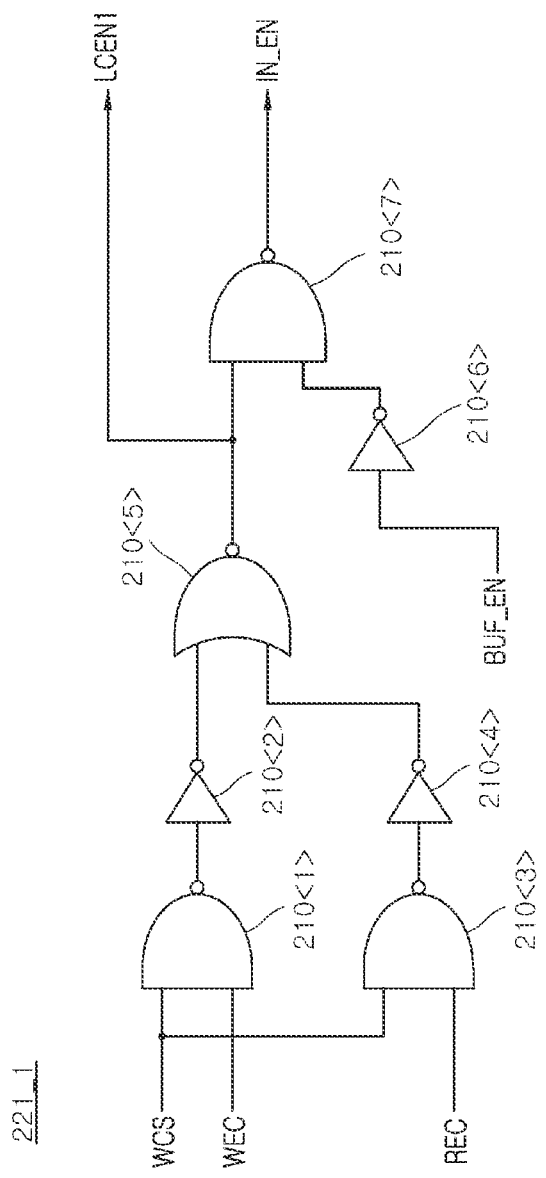
FIG. 5 is a circuit diagram illustrating a configuration of an input control circuit included in the buffer control circuit illustrated in FIG. 4.

FIG. 5 is a circuit diagram illustrating a configuration of an embodiment of the input control circuit 221_1. As illustrated in FIG. 5, the input control circuit 221_1 may include NAND gates 210<1>, 210<3>, and 210<7>, inverters 210<2>, 210<4>, and 210<6>, and a NOR gate 210<5>.

When the write control signal WEC is enabled to a logic high level and the write check command WCS is enabled to a logic high level, the input control circuit 221_1 may generate the first latch enable signal LCEN1 that is disabled to a logic low level. When the read control signal REC is enabled to a logic high level and the write check command WCS is enabled to a logic high level, the input control circuit 221_1 may generate the first latch enable signal LCEN1 that is disabled to a logic low level.

When the write control signal WEC is enabled to a logic high level and the write check command WCS is enabled to a logic high level, the input control circuit 221_1 may generate the input enable signal IN_EN that is enabled to a logic high level. When the read control signal REC is enabled to a logic high level and the write check command WCS is enabled to a logic high level, the input control circuit 221_1. may generate the input enable signal IN_EN that is enabled to a logic high level.

When the error correction test mode is ended and the normal mode is entered, the input control circuit 221_1 may generate the input enable signal IN_EN, which is enabled to a logic high level, by a buffer enable signal BUF_EN that is enabled to a logic high level.

Figure 6:
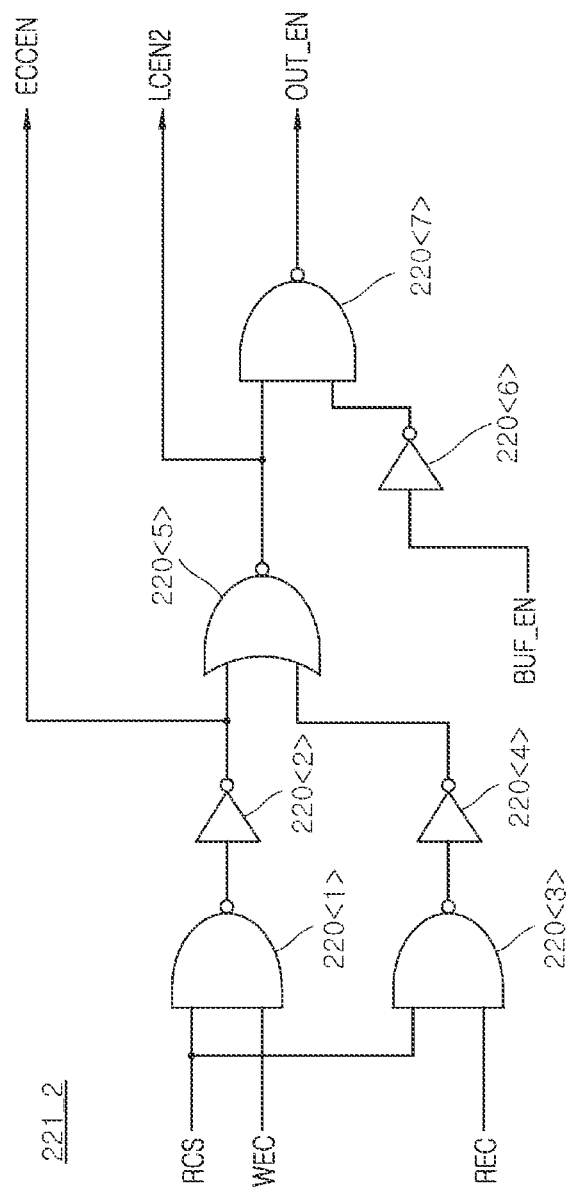
FIG. 6 is a circuit diagram illustrating a configuration of an output control circuit included in the buffer control circuit illustrated in FIG. 4.

FIG. 6 is a circuit diagram illustrating a configuration of an embodiment of the output control circuit 221_2. As illustrated in FIG. 6, the output control circuit 221_2 may include NAND gates 220<1>, 220<3>, and 220<7>, inverters 220<2>, 220<4>, and 220<6>, and a NOR gate 220<5>.

When the write control signal WEC is enabled to a logic high level and the read check command RCS is enabled to a logic high level, the output control circuit 221_2 may generate the error correction enable signal ECCEN that is enabled to a logic high level. When any one of the write control signal WEC and the read check command RCS is disabled to a logic low level, the output control circuit 221_2 may generate the error correction enable signal ECCEN that is disabled to a logic low level.

When the write control signal WEC is enabled to a logic high level and the read check command RCS is enabled to a logic high level, the output control circuit 221_2 may generate the second latch enable signal LCEN2 that is disabled to a logic low level. When the read control signal REC is enabled to a logic high level and the read check command RCS is enabled to a logic high level, the output control circuit 221_2 may generate the second latch enable signal LCEN2 that is disabled to a logic low level.

When the write control signal WEC is enabled to a logic high level and the read check command RCS is enabled to a logic high level, the output control circuit 221_2 may generate the output enable signal OUT_EN that is enabled to a logic high level. When the read control signal REC is enabled to a logic high level and the read check command RCS is enabled to a logic high level, the output control circuit 221_2 may generate the output enable signal OUT_EN that is enabled to a logic high level.

When the error correction test mode is ended and the normal mode is entered, the output control circuit 221_2 may generate the output enable signal OUT_EN, which is enabled to a logic high level, by the buffer enable signal BUF_EN that is enabled to a logic high level.

Figure 7:
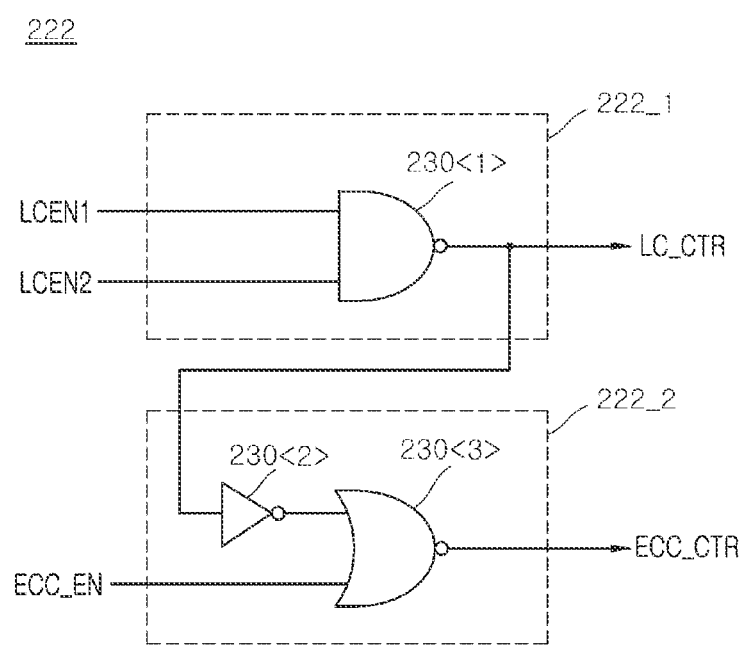
FIG. 7 is a circuit diagram illustrating a configuration of a test control circuit included in the control circuit illustrated in FIG. 3.

FIG. 7 is a circuit diagram illustrating a configuration of an embodiment of the test control circuit 222. As illustrated in FIG. 7, the test control circuit 222 may include a latch control signal generation circuit 222_1 and an error correction control signal generation circuit 222_2.

The latch control signal generation circuit 222_1 may be implemented with a NAND gate 230<1>. The latch control signal generation circuit 222_1 may generate the latch control signal LC_CTR based on the first latch enable signal LCEN1 and the second latch enable signal LCEN2. When any one of the first latch enable signal LCEN1 and the second latch enable signal LCEN2 is generated at a logic low level, the latch control signal generation circuit 222_1 may generate the latch control signal LC_CTR that is enabled to a logic high level. When both the first latch enable signal LCEN1 and the second latch enable signal LCEN2 are generated at logic high levels, the latch control signal generation circuit 222_1 may generate the latch control signal LC_CTR that is disabled to a logic low level.

The error correction control signal generation circuit 222_2 may be implemented with an inverter 230<2> and a NOR gate 230<3>. The error correction control signal generation circuit 222_2 may generate the error correction control signal ECC_CTR based on the latch control signal LC_CTR and the error correction enable signal ECCEN. When the error correction enable signal ECCEN is input at a logic low level during a period in which the latch control signal LC_CTR is enabled to a logic high level, the error correction control signal generation circuit 222_2 may generate the error correction control signal ECC_CTR that is enabled to a logic high level. When the latch control signal LC_CTR is input at a logic low level, the error correction control signal generation circuit 222_2 may generate the error correction control signal ECC_CTR that is disabled to a logic low level. When the error correction enable signal ECCEN is input at a logic high level, the error correction control signal generation circuit 222_2 may generate the error correction control signal ECC_CTR that is disabled to a logic low level.

Figure 8:
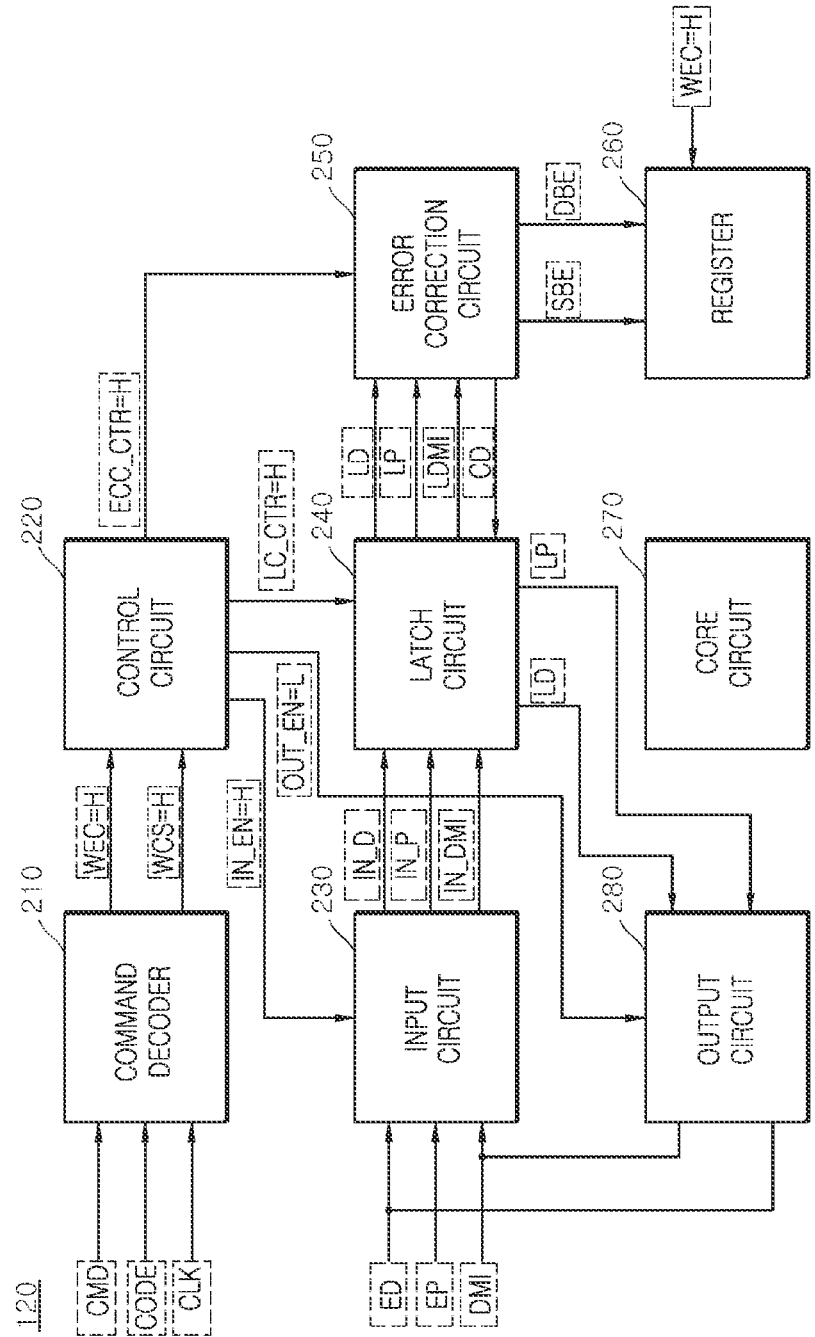
FIGS. 8 to 11 are diagrams to assist in the explanation of an operation of performing an error correction test mode in the semiconductor system in accordance with the embodiment of the disclosure.
Figure 9:
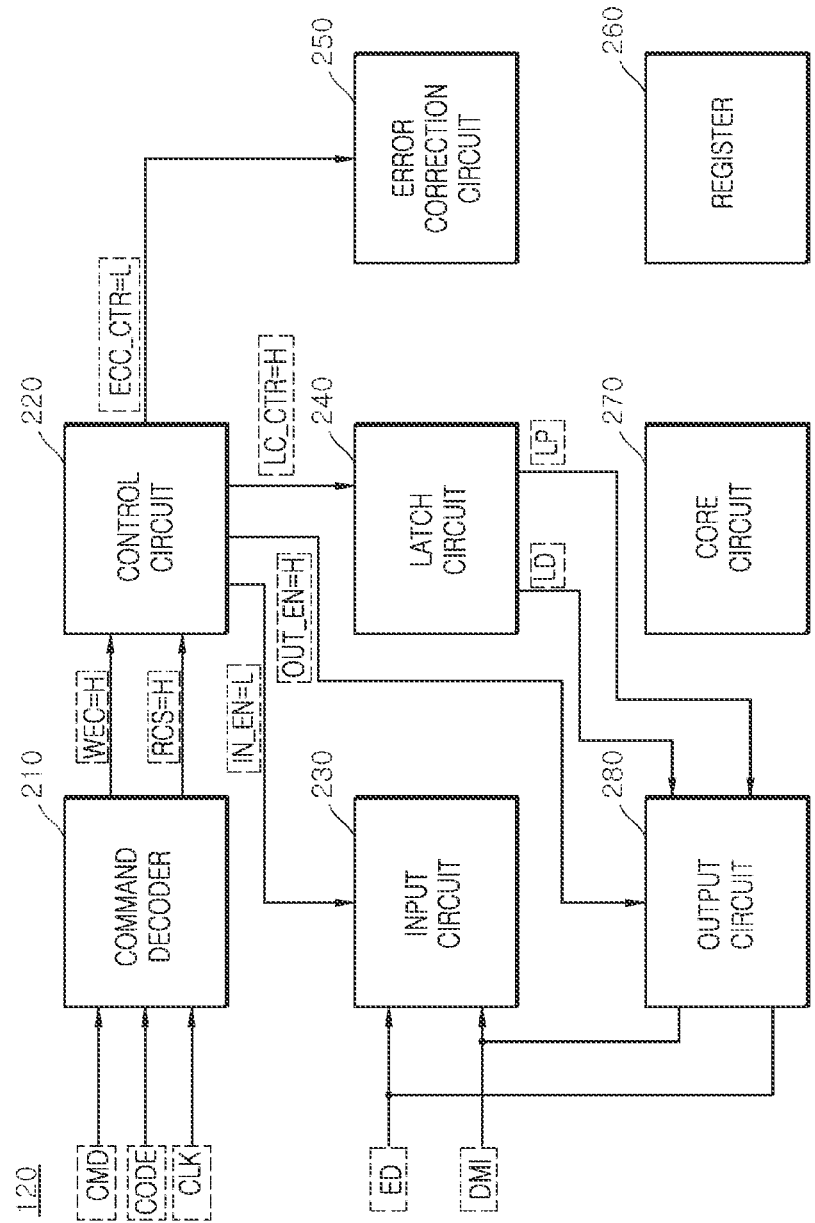

The operation of the error correction test mode of the semiconductor device 120, in accordance with the embodiment of the disclosure, will be described below with reference to FIGS. 8 and 9, by taking, as an example, an operation in which the error correction circuit 250 is tested by using the error-including external data ED in a write operation.

First, the operation of the error correction test mode will be described below with reference to FIG. 8, by taking, as an example, an operation in which the error-including external data ED is received in the write operation and the latch data LD is generated by correcting an error that is included in the external data ED.

The command decoder 210 may generate the write control signal WEC that is enabled to a logic high level based on the code signal CODE in synchronization with the clock CLK. The command decoder 210 may generate the write check command WCS that is enabled to a logic high level based on the command OVID in synchronization with the clock CLK.

The control circuit 220 may generate the input enable signal IN_EN that is enabled to a logic high level based on the write control signal WEC with a logic high level, and the write check command WCS with a logic high level. The control circuit 220 may generate the output enable signal OUT_EN that is disabled to a logic low level based on the write control signal WEC with a logic high level, the read control signal REC with a logic low level, and the read check command RCS with a logic low level. The control circuit 220 may generate the latch control signal LC_CTR that is enabled to a logic high level based on the write control signal WEC with a logic high level and the write check command WCS with a logic high level. The control circuit 220 may generate the error correction control signal ECC_CTR that is enabled to a logic high level based on the latch control signal LC_CTR with a logic high level, the write control signal WEC with a logic high level, and the read check command RCS with a logic low level.

During the period in which the input enable signal IN_EN is enabled to a logic high level, the input circuit 230 may generate the input data IN_D, the input parity IN_P and the input masking signal IN DMI from the internal data ID, the external data ED, the external parity EP, and the masking information signal DMI. At this time, all bits that are included in the masking information signal DMI may be input at logic low levels so as not to block bits that are included in the external data ED.

During the period in which the latch control signal LC_CTR is enabled to a logic high level, the latch circuit 240 may generate the latch data LD, the latch parity LP, and the latch masking signal LDMI by latching the input data IN_D, the input parity IN_P, and the input masking signal IN_DMI.

During the period in which the error correction control signal ECC_CTR is enabled to a logic high level, the error correction circuit 250 may generate the corrected data CD by correcting an error, included in the latch data LD, by performing the ECC decoding operation based on the latch data LD, the latch parity LP, and the latch masking signal LDMI. During the period in which the error correction control signal ECC_CTR is enabled, the error correction circuit 250 may generate the latch parity LP, which includes information on an error that is included in the latch data LD, by performing the ECC encoding operation. During the period in which the error correction control signal ECC_CTR is enabled, the error correction circuit 250 may generate the single bit error signal SBE, which is enabled when an error that is included in the latch data LD is 1 bit, by performing the ECC decoding operation. During the period in which the error correction control signal ECC_CTR is enabled, the error correction circuit 250 may generate the double bit error signal DBE, which is enabled when an error that is included in the latch data LD is at least 2 bits, by performing the ECC decoding operation.

The latch circuit 240 may re-store the corrected data CD as the latch data LD during the period in which the latch control signal LC_CTR is enabled to a logic high level. The latch circuit 240 may re-store the latch parity LP during the period in which the latch control signal LC_CTR is enabled to a logic high level.

The register 260 may be initialized based on the write control signal WEC with a logic high level, and, after being initialized, stores the single bit error signal SBE and the double bit error signal DBE.

Next, the operation of the error correction test mode will be described below with reference to FIG. 9, by taking, as an example, an operation in which the external data ED is generated from the latch data LD error-corrected in the write operation and is output to the controller 110.

The command decoder 210 may generate the write control signal WEC that is enabled to a logic high level based on the code signal CODE in synchronization with the clock CLK. The command decoder 210 may generate the read check command RCS that is enabled to a logic high level based on the command CMD in synchronization with the clock CLK.

The control circuit 220 may generate the input enable signal IN_EN that is disabled to a logic low level based on the write control signal WEC with a logic high level, the write check command WCS with a logic low level, and the read control signal REC with a logic low level. The control circuit 220 may generate the output enable signal OUT_EN that is enabled to a logic high level based on the write control signal WEC with a logic high level and the read check command RCS with a logic high level. The control circuit 220 may generate the latch control signal LC_CTR that is enabled to a logic high level based on the write control signal WEC with a logic high level and the read check command RCS with a logic high level. The control circuit 220 may generate the error correction control signal ECC_CTR that is disabled to a logic low level based on the latch control signal LC_CTR with a logic high level, the write control signal WEC with a logic high level, and the read check command RCS with a logic high level.

The input circuit 230 might not be driven because the input enable signal IN_EN is disabled to a logic low level.

The latch circuit 240 may output the latch data LD and the latch parity LP to the output circuit 280 during the period in which the latch control signal LC_CTR is enabled to a logic high level.

The error correction circuit 250 might not be driven because the error correction control signal ECC_CTR is disabled to a logic low level.

During the period in which the output enable signal OUT_EN is enabled to a logic high level, the output circuit 280 may generate the external data ED from the latch data LD and may generate the masking information signal DMI from the latch parity LP. During the period in which the output enable signal OUT_EN is enabled to a logic high level, the output circuit 280 may output the external data ED and the masking information signal DMI to the controller 110.

The controller 110 may test the error correction circuit 250 that is included in the semiconductor device 120 by receiving the external data ED and the masking information signal DMI. When an error of the external data ED is corrected, the controller 110 may confirm that the error correction circuit 250 performs a normal operation. When an error of the external data ED is not corrected, the controller 110 may confirm that the error correction circuit 250 performs an abnormal operation.

The semiconductor system 100, in accordance with the embodiment of the disclosure, configured as mentioned above, may test, in the error correction test mode, the error correction circuit 250 by correcting an error of the error-including external data ED through the error correction circuit 250 that is included in the semiconductor device 120 and detecting, by the controller 110, whether the error of the external data ED has been corrected. By testing, in the error correction test mode, the error correction circuit 250 that is included in the semiconductor device 120, the semiconductor system 100 may secure the reliability of data that is error-corrected through the error correction circuit 250 in the normal mode.

Figure 10:
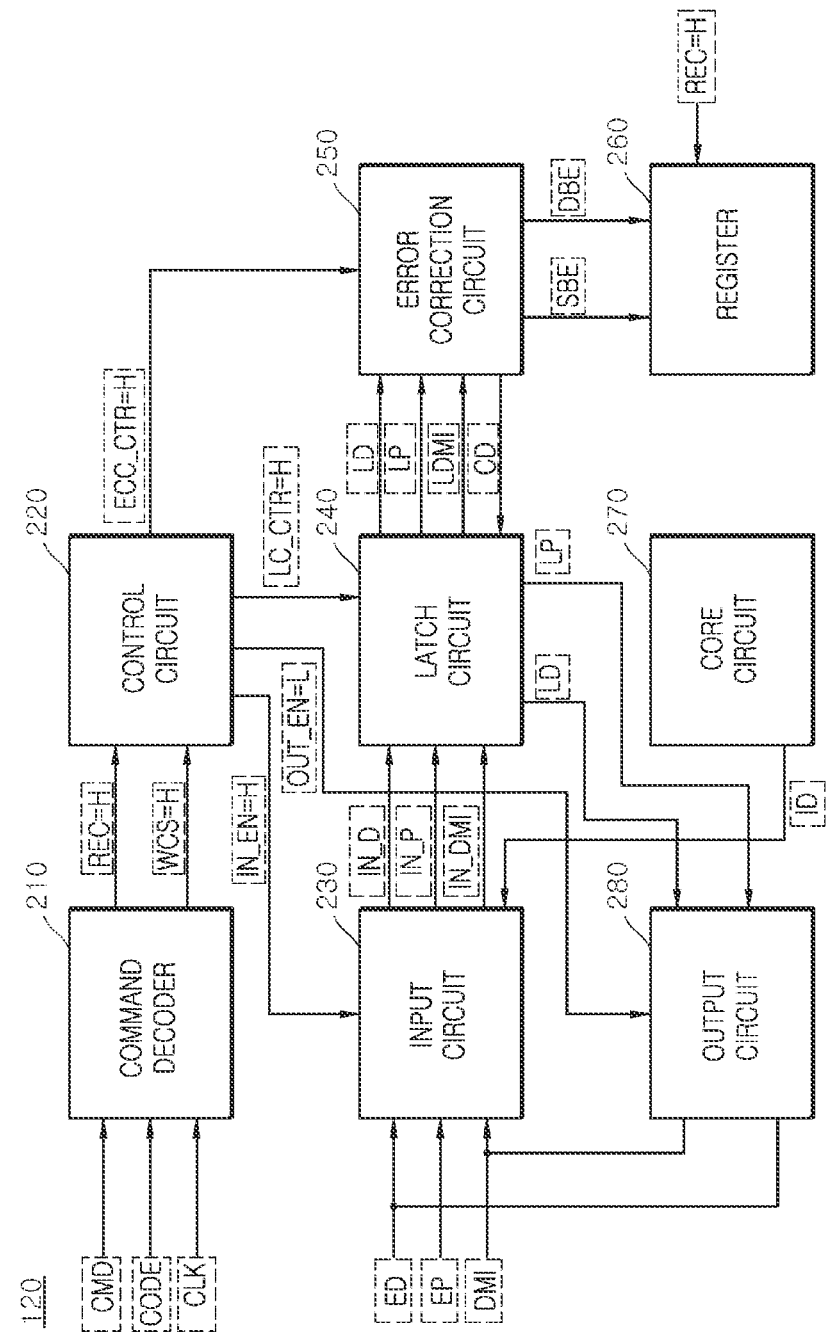
Figure 11:
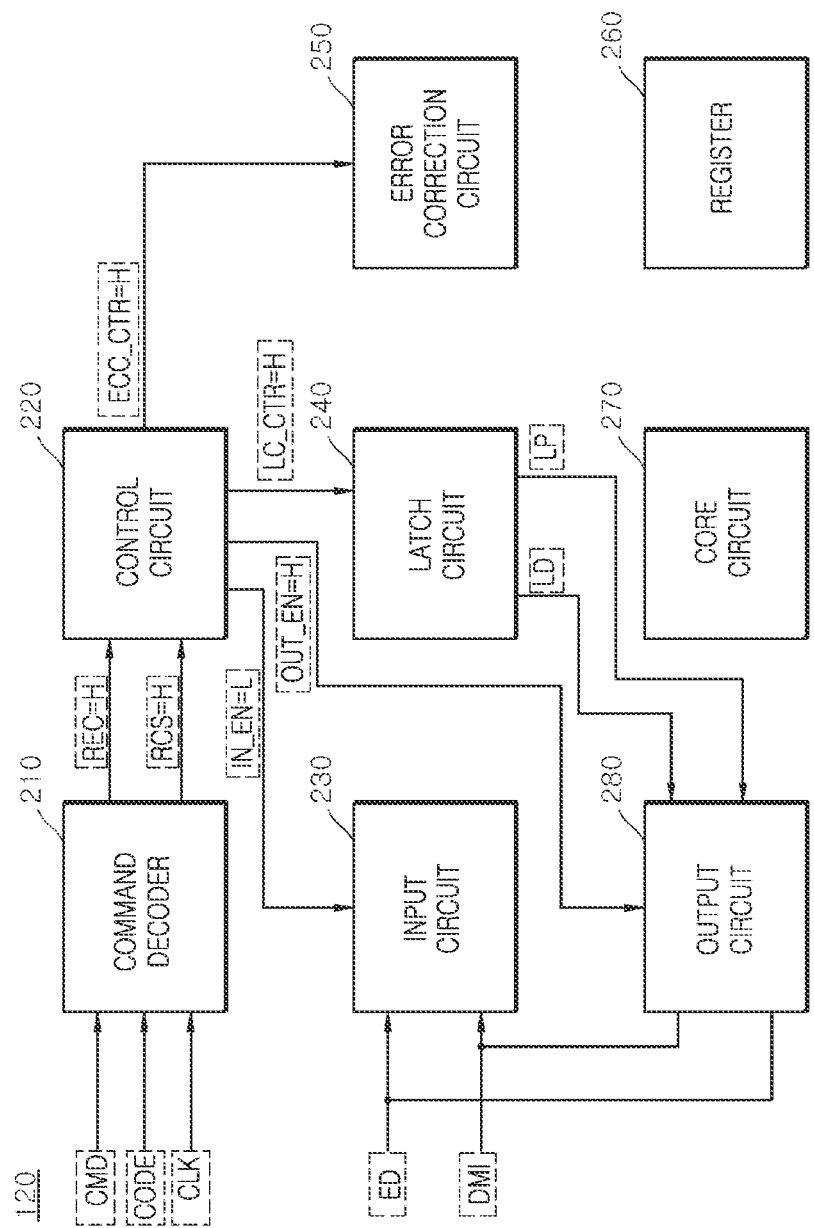

The operation of the error correction test mode of the semiconductor device 120, in accordance with the embodiment of the disclosure, will be described below with reference to FIGS. 10 and 11, by taking, as an example, an operation in which the error correction circuit 250 is tested using the non-error-including internal data ID and external data ED in a data masking operation.

First, the operation of the error correction test mode will be described below with reference to FIG. 10, by taking, as an example, an operation in which the external data ED is received in the data masking operation, the latch data LD is generated from the non-error-including internal data ID and external data ED and an error of the latch data LD is corrected.

The command decoder 210 may generate the read control signal REC that is enabled to a logic high level based on the code signal CODE in synchronization with the clock CLK. The command decoder 210 may generate the write check command WCS that is enabled to a logic high level based on the command CMD in synchronization with the clock CLK.

The control circuit 220 may generate the input enable signal IN_EN that is enabled to a logic high level based on the read control signal REC with a logic high level and the write check command WCS with a logic high level. The control circuit 220 may generate the output enable signal OUT_EN that is disabled to a logic low level based on the write control signal WEC with a logic low level, the read control signal REC with a logic high level, and the read check command RCS with a logic low level. The control circuit 220 may generate the latch control signal LC_CTR that is enabled to a logic high level based on the read control signal REC with a logic high level and the write check command WCS with a logic high level. The control circuit 220 may generate the error correction control signal ECC_CTR that is enabled to a logic high level based on the latch control signal LC_CTR with a logic high level, the write control signal WEC with a logic low level, and the read check command RCS with a logic low level.

The core circuit 270 may output the internal data ID that is stored therein to the input circuit 230.

During the period in which the input enable signal IN_EN is enabled to a logic high level, the input circuit 230 may generate the input data IN_D by blocking some bits of the external data ED based on the masking information signal DMI and by replacing the blocked some bits of the external data ED with the internal data ID. During the period in which the input enable signal IN_EN is enabled, the input circuit 230 may generate the input parity IN_P and the input masking signal IN_DMI by buffering the external parity EP and the masking information signal DMI. At this time, bits that are included in the masking information signal DMI may be selectively input at logic high levels so as to block bits that are included in the external data ED.

During the period in which the latch control signal LC_CTR is enabled to a logic high level, the latch circuit 240 may generate the latch data LD, the latch parity LP and the latch masking signal LDMI by latching the input data IN_D, the input parity IN_P and the input masking signal IN_DMI.

During the period in which the error correction control signal ECC_CTR is enabled to a logic high level, the error correction circuit 250 may generate the corrected data CD by correcting an error, included in the latch data LD, by performing the ECC decoding operation based on the latch data LD, the latch parity LP, and the latch masking signal LDMI. During the period in which the error correction control signal ECC_CTR is enabled, the error correction circuit 250 may generate the latch parity LP that includes information on an error, which is included in the latch data LD, by performing the ECC encoding operation. During the period in which the error correction control signal ECC_CTR is enabled, the error correction circuit 250 may generate the single bit error signal SBE, which is enabled when an error that is included in the latch data LD is 1 bit, by performing the ECC decoding operation. During the period in which the error correction control signal ECC_CTR is enabled, the error correction circuit 250 may generate the double bit error signal DBE, which is enabled when an error that is included in the latch data LD is at least 2 bits, by performing the ECC decoding operation.

The latch circuit 240 may re-store the corrected data CD as the latch data LD during the period in which the latch control signal LC_CTR is enabled to a logic high level. The latch circuit 240 may re-store the latch parity LP during the period in which the latch control signal LC_CTR is enabled to a logic high level.

The register 260 may be initialized based on the read control signal REC with a logic high level, and, after being initialized, stores the single bit error signal SBE and the double bit error signal DBE.

Next, the operation of the error correction test mode will be described below with reference to FIG. 11, by taking, as an example, an operation in which the external data ED is generated from the latch data LD error-corrected in the data masking operation and is output to the controller 110.

The command decoder 210 may generate the read control signal REC that is enabled to a logic high level based on the code signal CODE in synchronization with the clock CLK. The command decoder 210 may generate the read check command RCS that is enabled to a logic high level based on the command CMD in synchronization with the clock CLK.

The control circuit 220 may generate the input enable signal IN_EN that is disabled to a logic low level based on the write control signal WEC with a logic low level, the write check command WCS with a logic low level, and the read control signal REC with a logic high level. The control circuit 220 may generate the output enable signal OUT_EN that is enabled to a logic high level based on the read control signal REC with a logic high level and the read check command RCS with a logic high level. The control circuit 220 may generate the latch control signal LC_CTR that is enabled to a logic high level based on the read control signal REC with a logic high level and the read check command RCS with a logic high level. The control circuit 220 may generate the error correction control signal ECC_CTR that is enabled to a logic high level based on the latch control signal LC_CTR with a logic high level, the write control signal WEC with a logic low level, and the read check command RCS with a logic high level.

The input circuit 230 might not be driven because the input enable signal IN_EN is disabled to a logic low level.

The latch circuit 240 may output the latch data LD and the latch parity LP to the output circuit 280 during the period in which the latch control signal LC_CTR is enabled to a logic high level.

During the period in which the output enable signal OUT_EN is enabled to a logic high level, the output circuit 280 may generate the external data ED from the latch data LD and may generate the masking information signal DMI from the latch parity LP. During the period in which the output enable signal OUT_EN is enabled to a logic high level, the output circuit 280 may output the external data ED and the masking information signal DMI to the controller 110.

The controller 110 may test the error correction circuit 250 that is included in the semiconductor device 120 by receiving the external data ED and the masking information signal DMI. When an error of the external data ED is corrected, the controller 110 may confirm that the error correction circuit 250 performs a normal operation. When an error of the external data ED is not corrected, the controller 110 may confirm that the error correction circuit 250 performs an abnormal operation.

The semiconductor system 100, in accordance with the embodiment of the disclosure, configured as mentioned above, may test, in the error correction test mode, the error correction circuit 250 by correcting an error of the error-including external data ED through the error correction circuit 250 that is included in the semiconductor device 120 and detecting, by the controller 110, whether the error of the external data ED has been corrected, By testing, in the error correction test mode, the error correction circuit 250 that is included in the semiconductor device 120, the semiconductor system 100 may secure the reliability of data that is error-corrected through the error correction circuit 250 in the normal mode.

Figure 12:
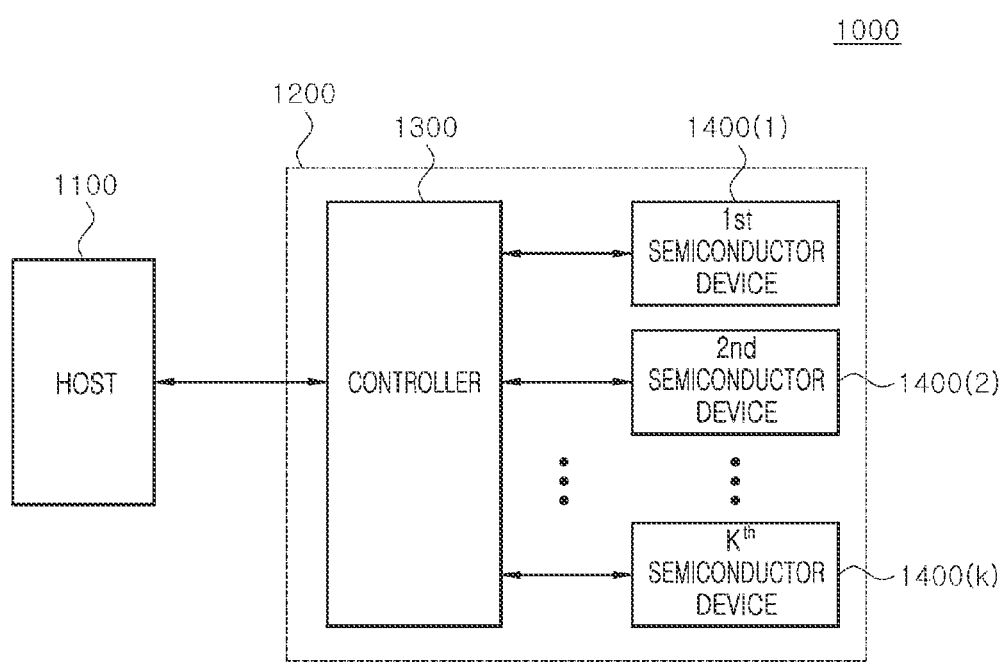
FIG. 12 is a diagram illustrating a configuration of an embodiment of an electronic system to which the semiconductor system illustrated in FIGS. 1 to 11 is applied.

FIG. 12 is a block diagram illustrating a configuration of an electronic system 1000, in accordance with an embodiment of the disclosure. As illustrated in FIG. 12, the electronic system 1000 may include a host 1100 and a semiconductor system 1200.

The host 1100 and the semiconductor system 1200 may transmit signals to each other by using an interface protocol. Examples of the interface protocol used between the host 1100 and the semiconductor system 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus.

The semiconductor system 1200 may include a controller 1300 and semiconductor devices 1400(K:1), The controller 1300 may control the semiconductor devices 1400(K:1) such that the semiconductor devices 1400(K:1) perform an error correction test mode and a normal mode. In the error correction test mode, each of the semiconductor devices 1400(K:1) may correct an error of error-including external data ED through an error correction circuit, and may output error-corrected external data ED to the controller 1300, The controller 1300 may test the error correction circuit by receiving external data ED from each of the semiconductor devices 1400(K:1) and detecting whether the external data ED is error-corrected. By testing, in the error correction test mode, the error correction circuit included in each of the semiconductor devices 1400(K:1), the semiconductor system 1200 may secure the reliability of data which is error-corrected through the error correction circuit in a normal mode.

The controller 1300 may be implemented with the controller 110, illustrated in FIG. 1. Each of the semiconductor devices 1400(K:1) may be implemented with the semiconductor device 120 illustrated in FIGS. 1 and 2. According to an embodiment, each of the semiconductor devices 1400(K:1) may be implemented with one among a DRAM (dynamic random access memory), a PRAM (phase change random access memory), an RRAM (resistive random access memory), an MRAM (magnetic random access memory) and an FRAM (ferroelectric random access memory).

Although some embodiments of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. A semiconductor device comprising:
   a control circuit configured to generate an input enable signal, an output enable signal, a latch control signal, and an error correction control signal based on a write control signal, a write check command, and a read check command for performing an error correction test mode;
   a latch circuit configured to generate latch data, a latch parity, and a latch masking signal by latching input data, an input parity, and an input masking signal and configured to re-store corrected data as the latch data, during a period in which the latch control signal is enabled; and
   an error correction circuit configured to generate the corrected data by correcting an error, included in the latch data, based on the latch data, the latch parity and the latch masking signal during a period in which the error correction control signal is enabled.

2. The semiconductor device according to claim 1, wherein the control circuit comprises:
   a buffer control circuit configured to generate a latch enable signal, an error correction enable signal, the input enable signal, and the output enable signal based on the write control signal, the write check command and the read check command; and
   a test control circuit configured to generate the latch control signal and the error correction control signal based on the latch enable signal and the error correction enable signal.

3. The semiconductor device according to claim 2, wherein the buffer control circuit comprises:
   an input control circuit configured to generate the latch enable signal and the input enable signal based on logic levels of the write control signal and the write check command; and
   an output control circuit configured to generate the error correction enable signal and the output enable signal based on logic levels of the write control signal and the read check command.

4. The semiconductor device according to claim 3, wherein the input control circuit is configured to:
   generate the latch enable signal which is disabled when both the write control signal and the write check command are enabled, and
   generate the input enable signal which is enabled when both the write control signal and the write check command are enabled.

5. The semiconductor device according to claim 3, wherein the output control circuit is configured to:
   generate the error correction enable signal which is enabled when both the write control signal and the read check command are enabled, and
   generate the output enable signal which is enabled when both the write control signal and the read check command are enabled.

6. The semiconductor device according to claim 2, wherein the test control circuit comprises:
   a latch control signal generation circuit configured to generate the latch control signal based on the latch enable signal; and
   an error correction control signal generation circuit configured to generate the error correction control signal based on the latch control signal and the error correction enable signal.

7. The semiconductor device according to claim 1, wherein the latch circuit is configured to generate, in the error correction test mode, the latch data from the input data that includes an error, and configured to re-store, in the error correction test mode, corrected data that is generated by correcting an error that is included in the latch data, as the latch data.

8. The semiconductor device according to claim 1, further comprising:
   an input circuit configured to generate the input data, the input parity, and the input masking signal from external data, an external parity, and a masking information signal during a period in which the input enable signal is enabled; and
   an output circuit configured to output the error-corrected latch data and the latch parity to an external device during a period in which the output enable signal is enabled.

9. The semiconductor device according to claim 8, wherein
   the input circuit is configured to generate, in the error correction test mode, the input data from the external data that includes an error, and configured to generate the input parity from the external parity that includes error information on the external data not including an error.

10. A semiconductor system comprising:
    a controller configured to test an error correction circuit that is included in a semiconductor device, by outputting a command for entering an error correction test mode, outputting first external data, a first external parity, and a first masking information signal to the semiconductor device and receiving a second external data and a second masking information signal that are output from the semiconductor device; and
    the semiconductor device, including the error correction circuit, configured to correct an error, included in the first external data, based on the first external data, the first external parity, and the first masking information signal, output the error-corrected first external data as the second external data, and output error information on the first external data as the second masking information signal.

11. The semiconductor system according to claim 10, wherein, in the error correction test mode, the controller is configured to output the first external data that includes an error and configured to output the first external parity that includes error information on the first external data not including an error.

12. The semiconductor system according to claim 10, wherein, in the error correction test mode, the controller is configured to test the error correction circuit based on whether an error is included in the second external data.

13. The semiconductor system according to claim 10, wherein the semiconductor device comprises:
a control circuit configured to generate an input enable signal, an output enable signal, a latch control signal, and an error correction control signal from a write control signal, a read control signal, a write check command, and a read check command that are generated based on the command and a code signal;
an input circuit configured to generate input data, an input parity, and an input masking signal from internal data, the first external data, the first external parity, and the first masking information signal during a period in which the input enable signal is enabled;
a latch circuit configured to generate latch data, a latch parity, and a latch masking signal by latching the input data, the input parity, and the input masking signal and re-store corrected data as the latch data during a period in which the latch control signal is enabled; and
the error correction circuit configured to generate the corrected data by correcting an error, included in the latch data, based on the latch data, the latch parity, and the latch masking signal during a period in which the error correction control signal is enabled.

14. The semiconductor system according to claim 13, wherein the control circuit comprises:
a buffer control circuit configured to generate first and second latch enable signals, an error correction enable signal, the input enable signal, and the output enable signal, based on the write control signal, the read control signal, the write check command, and the read check command; and
a test control circuit configured to generate the latch control signal and the error correction control signal, based on the first and second latch enable signals, and the error correction enable signal.

15. The semiconductor system according to claim 14, wherein the buffer control circuit comprises:
an input control circuit configured to generate the first latch enable signal and the input enable signal based on logic levels of the write control signal, the read control signal, and the write check command; and
an output control circuit configured to generate the error correction enable signal, the second latch enable signal, and the output enable signal based on logic levels of the write control signal, the read control signal, and the read check command.

16. The semiconductor system according to claim 15, wherein the input control circuit is configured to:
generate the first latch enable signal which is disabled when both the write control signal and the write check command are enabled,
generate the first latch enable signal which is disabled when both the read control signal and the write check command are enabled,
generate the input enable signal which is enabled when both the write control signal and the write check command are enabled, and
generate the input enable signal which is enabled when both the read control signal and the write check command are enabled.

17. The semiconductor system according to claim 15, wherein the output control circuit is configured to:
generate the error correction enable signal which is enabled when both the write control signal and the read check command are enabled,
generate the second latch enable signal which is disabled when both the write control signal and the read check command are enabled,
generate the second latch enable signal which is disabled when both the read control signal and the read check command are enabled,
generate the output enable signal which is enabled when both the write control signal and the read check command are enabled, and
generate the output enable signal which is enabled when both the read control signal and the read check command are enabled.

18. The semiconductor system according to claim 14, wherein the test control circuit comprises:
a latch control signal generation circuit configured to generate the latch control signal based on the first and second latch enable signals; and
an error correction control signal generation circuit configured to generate the error correction control signal based on the latch control signal and the error correction enable signal.

19. The semiconductor system according to claim 13, wherein the input circuit is configured to generate the input data by blocking some bits of the first external data based on the first masking information signal and replacing the blocked some bits of the first external data with the internal data.

20. The semiconductor system according to claim 13, further comprising:
an output circuit configured to generate the second external data from the error-corrected latch data, generate the second masking information signal from the latch parity, and output the second external data and the second masking information signal to the controller during a period in which the output enable signal is enabled.

* * * * *